(12) United States Patent
Otaki et al.

(10) Patent No.: US 7,323,275 B2
(45) Date of Patent: Jan. 29, 2008

(54) PHOTOSENSITIVE COMPOSITION FOR VOLUME HOLOGRAM RECORDING AND PHOTOSENSITIVE MEDIUM FOR VOLUME HOLOGRAM RECORDING

(75) Inventors: Hiroyuki Otaki, Tokyo (JP); Toshio Yoshihara, Tokyo (JP)

(73) Assignee: Dai Nippon Printing Co., Ltd, Tokyo (JP)

( * ) Notice: Subject to any disclaimer, the term of this patent is extended or adjusted under 35 U.S.C. 154(b) by 8 days.

(21) Appl. No.: 10/072,201

(22) Filed: Feb. 7, 2002

(65) Prior Publication Data

US 2002/0110740 A1 Aug. 15, 2002

(30) Foreign Application Priority Data

Feb. 9, 2001 (JP) ............................. 2001-033716
Feb. 9, 2001 (JP) ............................. 2001-033717
Jul. 31, 2001 (JP) ............................. 2001-232068

(51) Int. Cl.
  *G03H 1/02* (2006.01)
(52) U.S. Cl. .................... 430/1; 430/2; 430/290; 430/281.1; 359/3
(58) Field of Classification Search ............ 430/1, 430/2, 281.1, 280.1; 359/3
See application file for complete search history.

(56) References Cited

U.S. PATENT DOCUMENTS

| 3,016,297 | A | * | 1/1962 | Plambeck, Jr. et al. .. | 430/285.1 |
| 3,758,306 | A | * | 9/1973 | Roos ........................ | 430/260 |
| 4,272,608 | A |   | 6/1981 | Proskow |  |
| 4,842,968 | A | * | 6/1989 | Kojima et al. .................. | 430/1 |
| 5,453,340 | A | * | 9/1995 | Kawabata et al. ............. | 430/2 |
| 5,648,451 | A | * | 7/1997 | Sashida et al. ............. | 528/353 |
| 5,702,846 | A | * | 12/1997 | Sato et al. ..................... | 430/2 |
| 5,952,151 | A |   | 9/1999 | Sondergeld |  |
| 6,261,671 | B1 | * | 7/2001 | Asai et al. .................. | 428/206 |
| 6,524,771 | B2 | * | 2/2003 | Maeda et al. ............... | 430/290 |

FOREIGN PATENT DOCUMENTS

| EP | 0243933 A2 |   | 11/1987 |
| EP | 0938027 A1 |   | 8/1999 |
| GB | 2270172 |   | 3/1994 |
| JP | 63-264686 | * | 11/1988 |
| JP | 05-346662 | * | 12/1993 |
| JP | 06-161095 | * | 6/1994 |
| JP | 10-338850 | * | 12/1998 |
| JP | 2000-198964 | * | 7/2000 |
| JP | 2000-273418 | * | 10/2000 |
| WO | WO 97/38333 |   | 10/1997 |

OTHER PUBLICATIONS

Baney et al., "Silsesquioxanes" Chem. Rev. vol. 95(5) pp. 1409-1430 (1992).*
Herbert Krug et al., "Fine Patterning of Thin Sol-Gel Films", Journal of Non-Crystalline solids, 1992, pp. 447-450, Elsevier Science Publishers, Amsterdam, NL.

* cited by examiner

*Primary Examiner*—Martin Angebranndt
(74) *Attorney, Agent, or Firm*—Seyfarth Shaw LLP

(57) ABSTRACT

A photosensitive composition and A photosensitive medium for volume hologram recording comprises a photopolymerization reactive compound (a monomer) and any one of the following binder: (a) an organic-inorganic hybrid polymer obtainable by copolymerizing an organometallic compound of the formula 1 "$R^1m\ M^1\ (OR^2)$" and an ethylenic monomer and/or its hydrolyzed polycondensate; (b) an organic-inorganic hybrid polymer obtainable by copolymerizing an organometallic compound of the formula 3 "$R^4m\ Si\ (OR^5)\ n$" and an ethylenic monomer and/or its hydrolyzed polycondensate; and (c) a binder resin bonded to a metal or a combination use of a binder resin containing a hydroxyl group and/or carboxyl group and a metal chelate compound.

23 Claims, No Drawings

PHOTOSENSITIVE COMPOSITION FOR VOLUME HOLOGRAM RECORDING AND PHOTOSENSITIVE MEDIUM FOR VOLUME HOLOGRAM RECORDING

BACKGROUND OF THE INVENTION

1. Field of the Invention

The present invention relates to a photosensitive composition capable of recording a volume hologram, a volume hologram recording medium using the above-described composition, and a volume hologram prepared using the relevant recording medium.

The present invention relates to a photosensitive composition for forming a volume hologram applicable to, for example, a graphic art (CA), a security card and optical elements (HOE) such as a color filter, a reflection plate for display, a head-up display or the like, and a photosensitive medium for recording a volume hologram using the above-described composition.

2. Description of the Related Art

Conventionally, a medium recording three dimensional information of an objective as an interference fringe by causing the difference of a refractive index inside of the recording layer using the light irradiating onto the objective and the reference light has been known as a volume hologram. In recent years, a photosensitive composition for recording a drying developing type volume hologram in which a wet development processing is not needed and capable of being mass-produced in the manufacturing of a volume hologram has occupied the attention.

As a photosensitive composition for manufacturing such a volume hologram, the product of Omnidex series of I.E. du Pont de Nemours and Company is the only one product commercially available on the mass-production level, Although this material is mainly made of a radical polymerization monomer and a binder polymer, a photo-radical polymerization initiator and a sensitizing pigment, it utilizes the difference of refractive indices between a radical polymerization monomer and a binder polymer. Specifically, when the relevant photosensitive composition formed in a film shape is exposed to the interferential light, the radical polymerization is initiated at the regions where the light strongly irradiates, and accompanying with it, the concentration gradient of the radical polymerization monomer is made, and the diffusion shift is occurred from the regions where the light weakly irradiates to the regions where the light strongly irradiates. As a result, sparse and dense portions of the radical polymerization monomer are made, and this appears as the difference of the refractive indices. This material system has the best performance as a photopolymer for volume hologram reported at present, the refractive index modulation amount $\Delta n$ calculated by Kogelnik theory achieves to the order of 0.06 at maximum. However, the relevant Omnidex series (trade name) are weak at heat, and since these are colored, there is a limitation for the use of optical materials.

Moreover, a material system using a radical polymerization and cationic polymerization in combination has been reported. For example, Japanese Patent No. 2,873,126 discloses a system using a monomer having diallyl fluorene skeleton as a radical polymerization monomer having a high refractive index and a cationic polymerization monomer whose refractive index is smaller than that of the relevant a radical polymerization monomer. In this system, a component having a high refractive index is polymerized by radical polymerization at the time when it is exposed for forming the hologram, the radical polymerization monomer is diffused and shifted to the regions where the light irradiates, and the difference of the refractive indices is subsequently caused and the interference fringe is formed in accordance with a concentration distribution of the radical polymerization monomer, then the image is fixed by cationic polymerization with fixing exposure.

Moreover, a material system utilizing cationic polymerization has been disclosed, for example, in U.S. Pat. No. 5,759,721 and the like. Although there is an advantage in this material system that oxygen inhibition in the radical polymerization system does not exist, the photospeed of the cationic polymerization is slow, and there is also a problem that it is difficult for it to have the sensitivity to the long wavelength region.

Moreover, in Japanese Patent No. 2,953,200, an organic-inorganic hybrid material system for volume hologram using inorganic matrix network and photo-induced polymerization monomer in combination has been disclosed. In this system, an organic polymer invades into a rigid inorganic matrix networks the hologram recording medium is too rigid, and rolling in as a film becomes difficult, the processing appropriateness is bad, and there is a problem that a long time is needed at the time when forming a coating film. Moreover, since the affinity between an inorganic binder and an organic monomer is not good, there is also a problem that it is difficult to prepare a uniform coating material.

In the same as above Japanese Patent No, 2,953,200, that the flexibility is given to the inorganic binder by introducing an organic group in the inorganic matrix network, whereby the fragility of the hologram recording film is improved has been disclosed. However, in the same as above Japanese Patent No. 2,953,200, only that an organic group is introduced into the inorganic network by performing the hydrolysis and polycondensation polymerization of an organometallic compound having organic portion in side chain or an organometallic compound having a functional group capable of polymerizing with an organic monomer has been disclosed. Specifically, according to the disclosure of the same as above Japanese Patent No. 2,953,200, the network structure itself of the inorganic network is consisted of chains in which inorganic compounds are bonded each other, since the organic group is only introduced into the network structure of the inorganic network as a side chain in a pendant shape, it is not the one that essentially changes the rigid structure of the inorganic network.

Moreover, in Japanese Patent Application Laid-Open No. 2000-508783, the material in which metal ultra-fine particles are dispersed in the solid matrix as a hologram recording material has been disclosed, however, it is necessary to make the matrix fluidity and there has been a problem that the solid property is bad.

Moreover, as a material for volume hologram excellent at heat resistance, in Japanese Patent No. 3,075,081, hologram materials including a thermosetting epoxy oligomer, an aliphatic monomer capable of being radically polymerized, a photo-induced initiator for generating a radical species, a photo-induced initiator for activating cationic polymerization and a sensitizing pigment have been disclosed. However, the Value $\Delta n$ of the volume hologram according to the relevant gazette is not so satisfied.

A variety of material systems have been disclosed in order to form a volume hologram recording film, however if the applications to the wide range of fields such as optical element and the like are considered, it is not sufficient, it is desired for a material system to sufficiently satisfy not only the hologram recording performances such as difference of refractive indices, sensitivity, transparency and the like, but also a variety of performances including physical properties such as heat resistance, film strength, environmental resistance, mechanical strength, flexibility, processing appropriateness, coating compatibility and the like.

SUMMARY OF THE INVENTION

The present invention has been achieved in order to solve the above problems. It is an object of the present invention to provide a hologram recording material excellent at a variety of performances, concretely, a photosensitive composition for a volume hologram recording excellent at physical properties including heat resistance and mechanical strength as well as excellent at optical properties including a high Δn.

Moreover, another object of the present invention is to provide a volume hologram recording medium using such a hologram recording material and a volume hologram.

In order to achieve the above-described objects, the present invention provides a photosensitive composition for volume hologram recording and a photosensitive medium for volume hologram recording, which belong to the following respective aspects.

A photosensitive composition for volume hologram recording belonging to the first aspect of the present invention is characterized in that it comprises an organic-inorganic hybrid polymer and/or its hydrolyzed polycondensate, a photopolymerization reactive compound and a photopolymerization initiator, wherein said organic-inorganic hybrid polymer is obtainable by copolymerizing at least an organometallic compound represented by the following general formula 1 and a monomer having an ethylenically unsaturated bonding:

$$R^1{}_m M^1 (OR^2)_n \qquad \text{General formula 1:}$$

Wherein $M^1$ represents a metallic atom, $R^1$ may be identical or different and is a group having an ethylenically unsaturated bonding and containing 1-10 carbon atoms, $R^2$ may be identical or different and is alkyl group containing 1-10 carbon atoms, m+n represents the number of valence of metal $M^1$, $m \geq 1$ and $n \geq 1$.

A hologram recording material layer excellent at a variety of performances is formed and a photosensitive medium for volume hologram recording is obtained either by coating, as a binder polymer, a photosensitive composition for volume hologram recording containing the above-described organic-inorganic hybrid polymer or its partially hydrolyzed polycondensate on the substrate, and then performing hydrolysis and polycondensation polymerization, or by coating, as a binder polymer, the photosensitive composition for volume hologram recording containing hydrolysis condensate of the organic-inorganic hybrid polymer on the substrate and drying it.

A photosensitive medium for volume hologram recording of the present invention thus obtained is characterized in that a volume hologram recording material layer containing at least a hydrolyzed polycondensate of an organic-inorganic hybrid polymer obtainable by copolymerizing at least an organometallic compound represented by the following general formula 1 as a principal chain component and a monomer having an ethylenically unsaturated bonding also as a principal chain component, a photopolymerization reactive compound, and a photopolymerization initiator is provided on the substrate.

General formula 1:

$$R^1{}_m M^1 (OR^2)_n$$

Wherein $M^1$ represents a metallic atom, $R^1$ may be identical or different and is a group having an ethylenically unsaturated bonding and containing 1-10 carbon atoms, $R^2$ may be identical or different, and is alkyl group containing 1-10 carbon atoms, m+n represents the number of valence of metal $M^1$, $m \geq 1$ and $n \geq 1$.

Then, a hologram recording material layer of a photosensitive medium for volume hologram recording pertaining to the present invention becomes a hologram layer through generating an interference fringe by exposure to the interferential light and a volume hologram is obtained.

In the present invention, as a binder polymer, an organic-inorganic hybrid polymer and/or its hydrolyzed polycondensate is used. Since as this organic-inorganic hybrid polymer, a polymer having a high refractive index can be selected, it is possible to take the difference of refractive indices with a photo polymerization compound as large and a volume hologram having a large refractive index modulation amount (Δn) is obtained.

Moreover, a hologram recording material layer formed by coating a photosensitive composition for volume hologram recording pertaining to the present invention on the substrate and a hologram layer obtained by generating the interference fringe by performing the interferential exposure therein are formed in a structure in which the other components such as a photopolymerization component and a photopolymerization initiator and the like get into a gapping of the network structure formed by hydrolyzed-polycondensating the organic-inorganic hybrid polymer. Therefore, since a flexible portion is inserted into the chain forming the network structure, as a film physical property, it has the flexibility that the organic polymer has and the toughness and the heat resistance those the inorganic polymer has in combination and for all practical purposes, is excellent at processing appropriateness.

In one embodiment of the present invention, a photosensitive composition for volume hologram recording is characterized in that it further comprises an organometallic compound represented by the following general formula 2.

$$M^2 R^3{}_{n'} \qquad \text{General formula 2:}$$

wherein $M^2$ represents a metallic atom, $R^3$ may be identical or different and is a halogen, an alkyl group, alkoxyl group or acyloxy group containing 10 carbon atoms or less respectively or hydroxyl group, all or portion of these groups may be replaced with chelate ligand, and n' represents the number of valence of metal $M^2$.

Moreover, in another embodiment, a hydrolyzed polycondensate of the foregoing organic-inorganic hybrid polymer and/or its hydrolyzed polycondensate and the organometallic compound represented by the above-described general formula 2 is blended to the photosensitive composition for volume hologram recording as the foregoing hydrolyzed polycondensate.

In the case where a photosensitive medium for volume hologram recording is prepared using the photosensitive composition for volume hologram recording belonging to these embodiments, the foregoing volume hologram recording material layer comprises a hydrolyzed polycondensate made of the foregoing organic-inorganic hybrid polymer and/or its hydrolyzed polycondensate and the organometallic compound represented by the above-described general 2 as a binder.

The difference of refractive indices between the binder and the photopolymerization reactive compound can be enhanced by blending the above-described organometallic compound. Moreover, the organometallic compound not only raises the refractive index of the binder, but also has an effect to enhance the toughness and heat resistance of the film since the organometallic compound forms the network along with the organic-inorganic hybrid polymer.

Next, a photosensitive composition for volume hologram recording belonging to the second aspect of the present invention is characterized in that it comprises an organic-inorganic hybrid polymer which is obtainable by copolymerizing at least an organic silicon compound represented by the following general formula 3 and a monomer having an ethylenically unsaturated bonding and/or a hydrolyzed polycondensate of said organic-inorganic hybrid polymer, an organometallic particle which has a photopolymerization reactive group and is capable of exhibiting a refractive index different from that of hydrolyzed polycondensate of said organic-inorganic hybrid polymer when said organometallic particle is in a form of a polymer and a photopolymerization initiator;

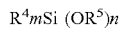  General formula 3:

Wherein $R^4$ may be identical or different and is a group having an ethylenically unsaturated bonding and containing 1-10 carbon atoms, $R^5$ may be identical or different and is an alkyl group containing 1-10 carbon atoms, $m+n=4$, $m \geq 1$ and $n \geq 1$.

The second aspect belongs to the first aspect, and the second aspect occupies one portion of the first aspect. Specifically, in the second aspect, it is characterized in that an organic silicon compound represented by the above-described general formula 3 is used as an organometallic compound represented by the general formula 1 of the first aspect, an organometallic particle which has a photopolymerization reactive group and is capable of exhibiting a refractive index different from that of hydrolyzed polycondensate of said organic-inorganic hybrid polymer when said organometallic particle is in a form of a polymer is used as a photopolymerization reactive compound of the first aspect.

A hologram recording material layer excellent at a variety of performances is formed and a photosensitive medium for volume hologram recording is obtained either by coating, as a binder polymer, a photosensitive composition for volume hologram recording containing the above-described organic-inorganic hybrid polymer or its partially hydrolyzed polycondensate on the substrate, and then performing the hydrolysis and the polycondensation polymerization, or by coating, as a binder polymer, the photosensitive composition for volume hologram recording containing hydrolysis condensate of the organic-inorganic hybrid polymer on the substrate and drying it.

A photosensitive medium for volume hologram recording of the present invention thus obtained is characterized in that a volume hologram recording material layer comprising a hydrolyzed polycondensate of an organic-inorganic hybrid polymer obtainable by copolymerizing at least an organic silicon compound represented by the above-described general formula 3 and a monomer having an ethylenically unsaturated bonding, and an organometallic particle which has a photopolymerization reactive group and is capable of exhibiting a refractive index different from that of hydrolyzed polycondensate of said organic-inorganic hybrid polymer when said organometallic particle is in a form of a polymer and a photopolymerization initiator is provided on the substrate.

Then, a hologram recording material layer of a photosensitive medium for volume hologram recording pertaining to the present invention becomes a hologram layer through causing an interference fringe by interferential exposure and a volume hologram is obtained.

In the present invention, as a binder polymer, an organic-inorganic hybrid polymer containing a backbone (principal chain) constitutional unit derived from an organic silicon compound and/or a hydrolyzed polycondensate of the organic-inorganic hybrid polymer is used. Since an organic silicon compound is quite lower in the refractive index than the other organometallic compounds, it is possible to take the difference of refractive index with an organometallic particle as a refractive index modulation component described later and a volume hologram having a high refractive index modulation amount ($\Delta n$) is obtained.

Furthermore, the dispersion property of the organometallic particle is excellent due to the inorganic backbone component derived from the organic silicon compound and the photosensitive composition for volume hologram recording is easily prepared to be a uniform coating liquid.

Moreover, a hologram recording material layer formed by coating a photosensitive composition for volume hologram recording pertaining to the present invention on the substrate and a hologram layer obtained by generating the interference fringe by performing the interferential exposure therein are formed in a structure in which the other components such as an organometallic particle and a photopolymerization initiator and the like get into a gapping of the network structure formed by hydrolyzed-polycondensating the organic-inorganic hybrid polymer. Therefore, since a flexible portion is inserted into the chain forming the network structure, as a film physical property, it has the flexibility that the organic polymer has and the toughness and the heat resistance those the inorganic polymer has in combination and for all practical purposes, is excellent at processing appropriateness.

In one embodiment of the present invention, a photosensitive component for volume hologram recording is characterized in that it further comprises an organic silicon compound represented by the following general 4:

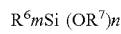  General formula 4:

wherein $R^6$ may be identical or different and is an alkyl group containing 1-10 carbon atoms, or a hydrocarbon group containing 1-10 carbon atoms and having an alkoxyl, a vinyl, an acryloyl, a methacryloyl, an epoxy, an amide, a sulfonyl, a hydroxyl or a carboxyl, $R^7$ may be identical or different and is an alkyl group containing 1-10 carbon atoms, $m+n=4$, $m \geq 1$, and $n \geq 1$.

Moreover, in another embodiment, a hydrolyzed polycondensate made of the foregoing organic-inorganic hybrid polymer and/or its hydrolyzed condensate and the organic silicon compound represented by the above-described general formula 4 is blended to a photosensitive composition for volume hologram recording as the foregoing hydrolyzed condensate.

In the case where a photosensitive medium for volume hologram recording is prepared using a photosensitive composition for volume hologram recording belonging to these embodiment, the foregoing volume hologram recording material layer comprises a hydrolyzed condensate made of the foregoing organic-inorganic hybrid polymer and/or its hydrolyzed polycondensate and the organic silicon compound represented by the above-described general 4 as a binder.

By blending the above-described organic silicon compound, a large amount of Si which is an inorganic component exists in the photosensitive composition for volume hologram recording, accordingly, the dispersion property of the organometallic particle is further enhanced.

Next, a photosensitive composition for volume hologram recording belonging to the third aspect of the present invention is characterized in that it comprises a binder resin bonded to a metal, a photopolymerization reactive compound, and a photopolymerization initiator.

A photosensitive composition for volume hologram recording or the present invention of the other form belonging to the third aspect is characterized in that it comprises a binder resin containing hydroxyl group and/or carboxyl group, a metal chelate compound, a photopolymerization reactive compound, and a photopolymerization initiator. The relevant photosensitive composition for volume hologram recording contains an oligomer in a state where the metal is not bonded and a metal chelate compound capable of bonding to hydroxyl group and/or carboxyl group of the relevant oligomer, a metal can be introduced and bonded to a binder resin in the processes such as coating film formation, post treatment after hologram recording and the like.

According to a photosensitive composition for volume hologram recording of the third aspect, since the binder resin can be subjected to raising of its refractive index by utilizing a binder resin bonded to a metal, or by utilizing a binder resin containing hydroxyl group and/or carboxyl group in combination with a metal chelate compound, Δn of an organic material-base photosensitive composition for volume hologram recording can be increased by utilizing the difference of the refractive indices between the binder resin endowed with a high refractive index and the polymer of the photopolymerization reactive compound.

A photosensitive composition for volume hologram recording of the third aspect may further comprise a sensitizing pigment in order to enhance the sensitivity in each laser beam wavelength at the time of the hologram recording. However, in the case where a photopolymerization initiator itself in the photosensitive composition for volume hologram recording has an absorbing wavelength of the visible laser, the sensitizing pigment may not be mixed.

An oligomer whose average molecular weight is in a range of 1,000-10,000 is preferable as a binder contained in a photosensitive composition for volume hologram recording of the third aspect. When an oligomer having such a molecular weight is used, the shift of the photopolymerization reactive compound which is the refractive index modulating component becomes active, and the separation from the photopolymerization reactive compound (monomer) is clearly performed, and a large difference of refractive index can finally be obtained in the volume hologram.

A binder contained in the photosensitive composition for volume hologram recording of the third aspect is preferably produced using multifunctional epoxy compound having a hydroxyl group or a carboxyl group. In the case where the foregoing oligomer is a multifunctional epoxy compound, it is desirable to mate it contain an acid generating catalyst for epoxy hardening. The use of the multifunctional epoxy compound having the hydroxyl group or carboxyl group enables to raise the refractive index of the oligomer by introducing a metal into a multifunctional epoxy compound and to obtain a volume hologram excellent at heat resistance and mechanical strength by thermally curing the epoxy group of the oligomer finally. Moreover, advantage of the epoxy compound is seen in the point of little shrinkage at the time when polymerization is performed.

A photosensitive medium for volume hologram recording manufactured using a photosensitive composition for volume hologram of the third aspect, is flexible and excellent at processing appropriateness which is different from the nature of the conventional organic-inorganic hybrid material based photosensitive medium for volume hologram recording in which the organic polymer is penetrated into the conventional inorganic network.

DESCRIPTION OF THE PREFERRED EMBODIMENTS

A. First Aspect of the Present Invention

A photosensitive composition for volume hologram recording belonging to the first aspect of the present invention contains at least an organic-inorganic hybrid polymer which is obtainable by copolymerizing at least an organometallic compound represented by the following general formula 1 and an organic monomer having an ethylenically unsaturated bonding as a principal chain (backbone chain) components respectively and/or its hydrolyzed polycondensation polymer, a photopolymerization reactive compound and a photopolymerization initiator as essential components, and may contain the other components such as the other organometallic compound, a sensitizing pigment and the like if it is necessary.

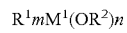  General formula 1:

Wherein $M^1$ represents a metallic atom, $R^1$ may be identical or different and is a group having an ethylenically unsaturated bonding and containing 1-10 carbon atoms, $R^2$ may be identical or different and is alkyl group containing 1-10 carbon atoms, m+n represents the number of valence of metal $M^1$, $m \geq 1$ and $n \geq 1$.

A hologram recording material layer excellent at a variety of performances is formed by coating, as a binder polymer, a photosensitive composition for volume hologram recording containing the above-described organic-inorganic hybrid polymer or its partially hydrolyzed polycondensate on the substrate, and then performing the hydrolysis and the polycondensation polymerization, or by coating, as a binder polymer, the photosensitive composition for volume hologram recording containing hydrolysis condensate of the organic-inorganic hybrid polymer on the substrate and drying it.

An organic-inorganic hybrid polymer is a copolymer obtainable by copolymerizing at least an organometallic compound represented by the following general formula 1 as a principal chain component and an organic monomer having an ethylenically unsaturated bonding also as a principal chain component, and preferably a random copolymer.

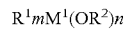  General formula 1:

Wherein $M^1$ represents a metallic atom, $R^1$ may be identical or different and is a group having an ethylenically unsaturated bonding and containing 1-10 carbon atoms, $R^2$ may be identical or different and is alkyl group containing 1-10 carbon atoms, m+n represents the number of valence of metal $M^1$, $m \geq 1$ and $n \geq 1$.

In the general formula 1, as metal atom $M^1$, for example, Si, Ti, Zr, Zn, In, Sn, Al, Se and the like are used. As a compound in the case where Si is used as a metal, a variety of vinylalkoxy silane including, vinyltriethoxy silane, vinyltrimethoxy silane, vinyltributoxy silane, vinyltriallyloxy silane, vinyltetraethoxy silane, vinyltetramethoxy silane, acryloxypropyltrimethoxy silane, methacryloxypropyltrimethoxy silane and the like are exemplified.

Moreover, as an organic monomer having an ethylenically unsaturated bonding, acrylic acid, acrylic esters, methacrylic acid, methacrylic esters are exemplified, however, but not limited to these.

An organic-inorganic hybrid polymer can be manufactured by performing the addition polymerization reaction of group containing an ethylenically unsaturated bonding (such as an ethylenically double bonding) of the organometallic compound represented by the general formula 1 and the ethylenically unsaturated bonding of an organic monomer by the general method. For example, an organic-inorganic hybrid polymer can be manufactured by throwing an organometallic compound and an organic monomer into solvents such as aromatic hydrocarbons such as benzene, toluene, xylene and the like, ketones such as acetone, methyl isobutyl ketone and the like, esters such as ethyl acetate, butyl acetate and the like, alcohols such as methanol, ethanol, isopropanol and the like, and further, by adding a polymerization initiator such as benzoyl peroxide, azoisobutylonitrile and the like, and then, after radical polymerizing while heating, and by removing the solvent.

When this organic-inorganic hybrid polymer is hydrolyzed and polycondensed by the sol-gel reaction, the organometallic compound portions within the different molecule or the same molecule of the organic-inorganic hybrid polymer are crosslinked, and forms a network (network structure). This network structure is constituted of a chain connection between the principal chain component derived from the organometallic compound and the other principal chain component derived from the organic monomer. Therefore, it is structurally different from the inorganic binder polymer disclosed in Japanese Patent No. 2,953,200, in which an organic group is introduced as a side chain in a pendant shape on the network made by linking only inorganic compounds, since as to the organic-inorganic hybrid polymer, the flexible portion is inserted into the chain constituting the network, as a film physical property, it has the flexibility that the organic polymer has, and the toughness and heat resistance that the inorganic polymer has in combination, and for all practical purposes, it is more excellent at processing appropriateness comparing with that disclosed in Japanese Patent No. 2,953,200.

Moreover, in the case of organic-inorganic hybrid polymer, it is possible to select a material having a higher refractive index comparing with the conventional organic polymer binders. There is the refractive index modulation amount ($\Delta n$) calculated by Kogelnik theory as one of the indices for hologram performances. $\Delta n$ indicates the difference of refractive indices in the refractive index distribution formed corresponding to the interference light incident into the sensitive material, and the larger this $\Delta n$ is, the more excellent the hologram becomes. Since the difference of refractive indices with the photopolymerization reactive compound as a refractive index modulation component described later can be taken as large by the organic-inorganic hybrid polymer whose refractive index is higher than that of the conventional organic polymer binder, the refractive index modulation amount ($\Delta n$) becomes larger, and it is advantageous from the viewpoint of the performance.

Furthermore, since the organic-inorganic hybrid polymer contains the principal chain component derived from the organic monomer, the affinity to photopolymerization reactive compound is excellent, and the photosensitive composition for volume hologram recording is easily prepared to be a uniform coating liquid comparing with the case in which the inorganic compound is used as a binder.

As to a photosensitive composition for volume hologram recording of the present invention, as a binder polymer, partial or complete hydrolyzed condensate of the foregoing organic-inorganic hybrid polymer may be used, or the mixture between the organic-inorganic hybrid polymer and its partial or complete hydrolyzed condensate may be used.

As to a photosensitive composition for volume hologram recording, as a binder polymer, according to the use, the foregoing organic-inorganic hybrid polymer and the various organic polymers may be mixed and used. As an organic polymer, the followings can be exemplified: polyacrylic ester, polymethacrylic ester or their partial hydrolysate; polyvinyl acetate or its partical hydrolysate; polyvinyl alcohol or its partial acetalisate; triacetyl cellulose; polyisoprene; polybutadien; polychloroprene; silicon rubber; polystyrene; poly(vinyl butyral); polychloroprene; poly(vinyl chloride); chlorinated polyethylene; chlorinated polypropylene; poly-N-vinyl carbasol or its derivative; poly-N-vinyl pyrolidone or its derivative; a copolymer of styrene and maleic anhydride or half ester; a copolymer comprising at least one polymerization component selected from the copolymerizable monomers including acrylic acid, acrylic ester, methacrylic acid, methacrylic ester, acrylamide, acrylnitrile, ethylene, propylene, vinyl chloride, vinyl acetate and the like.

Moreover, in order to further enhance the difference of refractive index between the binder and the photopolymerization reactive compound, the organometallic compound represented by the following general formula 2 can be also added to the photosensitive composition for volume hologram recording.

$$M^2R^3{}_{n'} \qquad \text{General formula 2:}$$

wherein $M^2$ represents a metallic atom, $R^3$ may be identical or different and is a halogen, an alkyl group, an alkoxyl group or an acyloxy group containing 10 carbon atoms or less and preferably containing 4 or less carbon atoms respectively, or a hydroxyl group, all or portion of these groups may be replaced with chelate ligand, and n' represents the number of valence of metal $M^2$.

In the general formula 2, as the metal atom $M^2$, for example, Si, Ti, Zr, Zn, In, Sn, Al, Se and the like are used. In the case where a high refractive index type binder and a low refractive index type photopolymerization reactive compound are used in combination, in order to enhance the difference of both refractive indices, it is preferable to use the metal ($M^2$) whose refractive index is as high as possible. As such a metal compound, for example, trimethoxy aluminum, triethoxy aluminum, triisopropoxy aluminum, tri-n-propoxy aluminum, tri-n-butoxy aluminum, tri-sec-butoxy aluminum, tri-tert-butoxy aluminum, tetramethoxy zirconium, tetraethoxy zirconium, tetraisopropoxy zirconium, tetra-n-butoxy zirconium, tetra-sec-butoxy zirconium, tetra-tert-butoxy zirconium, tetramethoxy titanium, tetraethoxy titanium, tetraisopropoxy titanium, tetra-n-propoxy titanium, tetra-n-butoxy titanium, tetra-sec-butoxy titanium, tetra-tert-butoxy titanium, and a complex between any one of these and any one of acetylacetone, ethyl acetoacetate, alkanolamines, glycols or their derivatives, and the like can be exemplified.

When the organometallic compound represented by the general formula 2 is added to the photosensitive composition for volume hologram recording, the network is formed by the sol-gel reaction in the presence of water and acid catalyst along with the above-described organic-inorganic hybrid polymer, there are not only the effect to enhance the refractive index of the binder, but also the effect to enhance the toughness and heat resistance of the film.

Although the organic-inorganic hybrid polymer and the organometallic compound represented by the general formula 2 form a network in which both exist in a mixture state by hydrolyzing and polycondensing both after mixing these, in principle, it is also possible to form the network in which both exist in a mixture state by mixing both after one of these or both of these being partially hydrolyzed and polycondensed, and further, by hydrolyzing and polycondensing after the mixture.

A photopolymerization reactive compound is a component (refractive index modulation component) for forming an interference fringe by modulating the refractive index of the strongly exposed regions at the time when the interferential exposure is done. A photo polymerization active compound to be used can exhibit, when it is in a form of a polymer obtained by polymerizing the relevant photopolymerization reactive compound, a refractive index different from the refractive index of the hydrolyzed polycondensate of the above-described organic-inorganic hybrid polymer, and preferably the compound causing the difference of the both refractive indices as 1.0 or more is employed.

As a photopolymerization reactive compound which is a compound capable of being copolymerized, a photo-radical polymerization compound and a photo-cationic polymerization compound can be employed. As a photo-radical polymerization compound, a compound having at least one ethylenically unsaturated bonding which is addition-polymerizable can be listed, for example, unsaturated carboxylic acid and its salt, an ester of unsaturated carboxylic acid and aliphatic multivalent alcoholic compound, amide bonding product of unsaturated carboxylic acid and aliphatic multivalent amine compound can be listed.

As a concrete example, the following monomers of esters of unsaturated carboxylic acid and aliphatic multivalent alcohol compound can be listed. Specifically, as a monomer of acrylic ester, ethylene glycol diacrylate, triethyleneglycol diacrylate, 1,3-butanediol diacrylate, tetramethyleneglycol diacrylate, propyleneglycol diacrylate, neopentylglycol diacrylate, trimethylolpropane tri-crylate, trimethylolpropane tri-(acryloyloxypropyl) ether, trimethylolethane triacrylate, hexanediol diacrylate, 1,4-cyclohexanediol diacrylate, tetraethyleneglycol di-acrylate, pentaerythritol diacrylate, pentaerythritol triacrylate, pentaerythritol tetraacrylate, dipentaerythritol diacrylate, dipentaerythritol triacrylate, dipetitaerythritol tetraacrylate, dipentaerythritol hexaacrylate, sorbitol triacrylate, sorbitol tetraacrylate, sorbitol pentaacrylate, sorbitol hexaacrylate, tri(lacryloyloxyethyl) isocyanurate, polyetster acrylate oligomer, 2-phenoxyethyl acrylate, 2-phenoxyethyl methacrylate, phenolethoxylate monoacrylate, 2-(p-chlorophenoxy) ethylacrylate, p-chlorophenyl acrylate, phenyl acrylate, 2-phenylethyl acrylate, (2-acryloxyethyl) ether of bisphenol A, ethoxylated bisphenol A diactylats, 2-(1-naphtyloxy) ethyl acrylate, o-bisphenyl methacrylate, o-biphenyl acrylate and the like are listed.

Furthermore, as a monomer of methacrylic ester, tetratethyleneglycol dimethacrylate, triethyleneglycol direthacrylate, neopentylglycol dimethacrylate, trimethylolpropane trimethacrylate, trimethylolethane trimethacrylate, ethyleneglycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis-[p-(3-methacryloxy-2-hydroxypropoxy) phenyl]dimethylmethane, bis-[p-(acryloxyethoxyphenyl)]dimethylmethane, 2,2-bis-(4-methacryloyloxyphenyl) propane, methacrylic acid-2-naphtyl and the like are listed.

As a photo-cationic polymerization compound, cyclic ethers of which epoxy ring and oxetane ring are representative, thio ethers and vinyl ethers are listed. Concretely, a compound containing epoxy ring will be listed as follows: polyalkylene glycol diglycidyl ether, bisphenol A diglycidyl ether, glycerin triglycidyl ether, diglycerol triglycidyl ether, diglycidyl hexahydrophthalate, trimethylolpropanediglycidyl ether, allylglycidyl ether, phenylglycidyl ether, cyclohexene oxide and the like. Moreover, as a concrete example of a compound containing oxetane ring, 3-ethyl-3-[(2-ethylhexcyloxy)methyl]oxetane, bis{[1-ethyl(3-oxetanyl)]methyl}ether and the like can be listed.

As a photopolymerization reactive compound, it is preferable to employ the compound which makes the difference of the refractive index with the organic-inorganic hybrid polymer as large as possible after the interferential exposure. The refractive indices of the organic-inorganic hybrid polymer and its hydrolyzed polycondensate differ depending on the metallic component. For example, in the case where an organic silicon compound is employed as an organometallic compound of the general formula 1, since the refractive index becomes quite small, it is preferable to employ the photopolymerization active compound as larger as possible than that of an organometallic compound of the general formula 1. On the other hand, in the case where an organic titanium compound and an organic zirconium compound is employed as an organometallic compound of the general formula 1, since the refractive index becomes quite large, it is preferable to employ the photopolymerization reactive compound whose refractive index is as smaller as possible than that of these compounds.

In the present invention, since it is easy to select an organic-inorganic hybrid polymer having a high refractive index as a binder polymer, the difference of the refractive indices can be taken as large by employing a photopolymerization reactive compound having a smaller refractive index in combination with such an organic-inorganic hybrid polymer having a higher refractive index, it is particularly preferable. As a photopolymerization reactive compound having a smaller refractive index, the following photopolymerization reactive compound having a refractive index of 1.49 or less can be exemplified: aliphatic monomers such as polyethylene glycol monoacrylate, polyethyleneglycol diacrylate, polyethyleneglycol dimethacrylate, trimethylolpropane triacrylate, trimethylolpropane trimethacrylate, hexanediol diacrylate, pentaerythritol tetraacrylate and the like, and fluorine based monomers such as 1H, 1H, 2H, 2H-heptadecafluorodecyl metacrylate (for example, trade name; Biscoat 17FM; made by Osaka Organic Chemical, Ltd., Co.), 1H, 1H, 5H-octafluoropentyl methacrylate (for example, trade name; Biscoat 8FM; made by Osaka Organic Chemical, Ltd., Co.), 2-(perfluoro-3-methylbutyl) ethyl methacrylate (for example, trade name; M-3420; made by Daikin Industries., Co.), 2-(perfluorodecyl) ethyl methacrylate (for example, trade name; M-2020; made by Daikin Industries Co.), 3-(1H, 1H, 9H-hexadecafluorononyloxy)-1, 2-epoxypropane (for example, trade name; E-5844; made by Daikin Industries., Co.), 1,4-bis(2',3'-epoxypropyl)-perfluoro-n-butane (for example, trade name; E-7432; made by Daikin Industries. Co.).

As a photo-induce polymerization compound, it is also possible to use oligomer-type or polymer-type of the compounds exemplified above.

A photopolymerization initiator is employed for initiating or promoting the polymerization of the photopolymerization active compound due to the interferential exposure, and it is appropriately selected from photo-radical polymerization initiators and photo-cationic polymerization initiators and the like and employed in accordance with a reaction type of the polymerization.

As a photo-radical polymerization initiator, 1,3-di(t-butyldioxycarbonyl) benzophenone, 3,3',4,4'-tetrakis(t-butyldioxycaronyl) benzophenone, N-phenylglycine, 2,4,6-tris(trichloromethyl)-s-triazine, 3-phenyl-5-isooxazolone, 2-mercaptobenzimidazole, and imidazole dimers and the like can be exemplified.

As a photo-cationic polymerization initiator, aromatic diazonium salt, aromatic iodonium salt, aromatic sulfonium salt, aromatic phosphonium salt, mixture ligand metallic salts, for example, $(\eta^6$-benzene) $(\eta^5$-cyclopentadienyl) iron (II), silanol-alumium complex and the like can be exemplified.

It is preferable that a photopolymerization initiator is subjected to decomposition from the viewpoint of the stability of the hologram recorded after hologram recording. For example, the initiator of organic peroxide series is preferable since that initiator is easily broken up by irradiating ultraviolet ray. For a hologram recording, a visible laser beam, that is, a laser beam selected from, for example, argon ion laser (458 nm, 488 nm, 514.5 nm)), kryton ion laser (647.1 nm), YAG laser (532 nm) and the like is used. For the purpose of enhancing the sensitivity in each laser beam wavelength, a sensitizing pigment can be added.

As a sensitizing pigment, thiopyrylium salt based pigment, merocyanine based pigment, quinoline based pigment, styrylquinoline based pigment ketocoumarin based pigment, thioxanthane based pigment, xanthane based pigment, oxonol based pigment, cyanine based pigment, rhodamine based pigment, pyrylium based pigment and the like are exemplified. As for a sensitizing pigment having an absorbing wavelength in a visible light region, in the case where a high transparency such as optical element is required, it is preferable to use a pigment which becomes colorless by decomposition processing using heating and ultraviolet ray radiation after the process of hologram recording.

As to a photopolymerization reactive compound, it is used at the ratio of 10-1,000 weight parts of it with respect to 100 weight parts of an organic-inorganic hybrid polymer, which is a binder polymer, and preferably at the ratio of 10-100 weight parts of it to 100 weight parts of the hybrid polymer.

As to a photopolymerization initiator, it is used at the ratio of 1-10 weight parts of it with respect to 100 weight parts of the binder polymer, and preferably at the ratio of 5-10 weight parts of it to 100 weight parts of the binder polymer.

An organometallic compound of the general formula 2 blended if it is necessary is used at the ratio of 10-100 weight parts with respect to 100 weight parts of the binder polymer, and preferably at the ratio of 20-70 weight parts with respect to 100 weight parts of the binder polymer.

As to a sensitizing pigment, it is used at the ratio of 0.01-1 weight parts with respect to 100 weight parts of the binder polymer, and preferably at the ratio of 0.01-0.5 weight parts with respect to 100 weight parts of the binder polymer.

A coating liquid as a photosensitive composition for volume hologram recording pertaining to the present invention can be prepared by dissolving the respective materials as described above in a solvent such as acetone, methylethyl ketone, methylisobutyl ketone, cyclohexanone, benzene, toluene, xylene, chlorobenzene, tetrahydrofuran, methyl cellosolve, ethyl cellosolve, methyl cellosolve acetate, ethyl cellosolve acetate, ethyl acetate, 1,4-dioxane, 1,2-dichloroethane, dichloromethane, chloroform, methanol, ethanol, isopropanol and the like or their mixed solvent. However, in the case where the photopolymerization reactive compound is in a liquid state, at ordinary temperature, the amount of use of the coating solvent can be reduced, and there are some cases where the coating solvent is not required at all.

The above-described coating liquid is coated on an appropriate substrate by the method of spin coater, gravure coater, comma coater, bar coater or the like. The thickness of a volume hologram material layer may be 1-100 μm, and preferably, 10-40 μm.

As a substrate of a photosensitive medium for volume hologram recording, transparent materials in a form of film or plate may be used. The material forming the substrate includes glass and resins such as polyethylene, polypropylene, polyethylenefluoride based resin, polyvinylidenfluoride, polyvinyl chloride, polyvinylidene chloride, ethylenevinylalcohol, polyvinyl alcohol, polymethyl methacrylate, polyether sulfone, polyether ether ketone, polyamide, tetrafluoroethylene-perfluoroalkylvinyl ether copolymerization, polyesters including polyethylene terephthalate, polyimide and the like. As a thickness of the substrate film, it may be 2-2,000 μm, and preferably, 10-200 μm.

A hydrolysis polycondensation reaction of a photosensitive composition for volume hologram recording (sol-gel reaction) can be easily proceeded and completed by leaving as it is for 15 minutes to 12 hours at −10° C. to 35° C., preferably 0° C. to 25° C., in the presence of suitable amount of water at an optional timing prior to or after coating on the substrate.

In the above-described hydrolysis polycondensation, it is preferable that a catalyst is used. As a catalyst, it is preferably an acid such as hydrochloric acid, nitric acid, sulfuric acid, acetic acid or the like, these acids can be used as an aqueous solution on the order of 0.001-20.0 N, and preferably 0.005-5.0 N.

A photosensitive medium for volume hologram recording can be obtained, for example, by coating a coating liquid of the photosensitive composition for volume hologram recording on the substrate, drying after sufficiently hydrolyzing and polycondensing the coated film and forming a coated film (volume hologram recording material layer) of the photosensitive composition for volume hologram, Moreover, a photosensitive medium for volume hologram recording is also obtained by partially or completely hydrolyzing and polycondensing the coating liquid of the photosensitive composition for volume hologram recording, then coating it on the suitable substrate, and drying and forming the coated film of the photosensitive composition for volume hologram recording (volume hologram recording material layer).

An organic-inorganic hybrid polymer, which is a binder polymer, may be mixed with other materials after previously been hydrolyzed and polycondensed.

In the case where the organometallic compound of the general formula 2 as an accessory binder, it may be also mixed with other materials after an organic-inorganic hybrid polymer and the organometallic compound are mixed and hydrolyzed and polycondensed. Furthermore, as a modified example, after one of the organic-inorganic hybrid polymer and the organometallic compound or both of these singly and partially have been hydrolyzed and polycondensed previously, these may be mixed with the other components, prepared into the coating liquid and completely polycondensed following the coating.

Catalysts such as water, acid, alkali and the like needed for hydrolysis and polycondensation reactions may be blended at the same time with the respective materials or may be added later. For example, in the case where the hydrolysis and polycondensation are performed following the coating, it may be added immediately before the coating in the coating liquid, or in the case where the hydrolysis and polycondensation are performed prior to the coating, it may be added immediately before the hydrolysis and polycondensation reactions are performed.

Moreover, in the case where the volume hologram recording material layer has the adhesiveness following the drying, the film exemplified in the above-described substrates can be laminated as a protective film. In this case, the contact surface of the laminating film with the volume hologram recording material layer may be processed to be a release type surface so as to be easily peeled off later.

The photosensitive medium for volume hologram recording thus obtained is a medium that the volume hologram recording material layer is provided on the Substrate, the relevant volume hologram recording material layer contains a hydrolyzed polycondensate in which a hydrolyzed polycondensate of the organic-inorganic hybrid polymer or the organic-inorganic hybrid polymer and the organometallic compound exist in a mixed state, a photopolymerization active component and a photopolymerization initiator as essential components, the relevant hologram recording material layer is formed in a structure in which the other components such as the photo polymerization active component and the photopolymerization initiator and the like get into a gapping of the network where a hydrolyzed polycondensate of the organic-inorganic hybrid polymer or the organic-inorganic hybrid polymer and the organometallic compound exist in a mixed state.

In a photosensitive medium for volume hologram recording pertaining to the present invention, a volume hologram can be formed by performing the interferential exposure by the method conventionally known.

For example, a volume hologram is formed by making the original plate of hologram faced and adhered to the hologram recording material layer of the photosensitive medium for volume hologram recording, and by performing the interferential exposure using visible light or ionizing radiation such as ultraviolet ray, electron ray from the side of the transparent substrate.

Moreover, the processing such as whole surface exposure to the light source, heating and the like can be appropriately performed after the interferential exposure in order to promote the refractive index modulation by the interferential exposure or complete the polymerization reaction.

It is considered that the recording mechanism of volume hologram of a photosensitive composition for volume hologram recording in the present invention is similar to the mechanism conventionally referred to. Specifically, when the relevant photosensitive composition formed in a film shape is exposed to the interferential light, the radical polymerization is initiated at the regions where the light strongly irradiates, and accompanying with it, the concentration gradient of the radical polymerization monomer is made, and the diffusion shift of the photopolymerization reactive compound is occurred from the regions where the light weakly irradiates to the regions where the light strongly irradiates. As a result, regions where the photopolymerization reactive compound richly exists and regions there the binder polymer richly exists are made, and this appears as the difference of the refractive indices. The difference of the refractive indices becomes an interference fringe, and the volume hologram is formed.

In this way, a hologram recording material layer of a photosensitive medium for volume hologram recording pertaining to the present invention generates an interference fringe by the interferential exposure to be a hologram layer, and a volume hologram is obtained.

It is considered that the difference of the refractive indices occurred in the interference fringe of the hologram layer in the present invention is a difference of the refractive indices generated between the regions containing the organic-inorganic hybrid polymer which is a binder polymer at a high ratio and the regions containing the photopolymerization reactive compound at a high ratio. Since as to the organic-inorganic hybrid polymer, a polymer having a higher refractive index can be selected, the difference of the refractive indices with the photopolymerization reactive compound is capable of being taken largely, and a volume hologram having a large refractive index modulation amount ($\Delta n$) is obtained.

A hologram recording material layer of a photosensitive medium for volume hologram recording pertaining to the present invention generates an interference fringe by the interferential exposure to be a hologram layer, this hologram layer is, similar to the above-described hologram recording material layer, has a structure in which the other components such as the photopolymerization reactive component and the photopolymerization initiator and the like get into a gapping of the network where a hydrolyzed polycondensate of the organic-inorganic hybrid polymer or the organic-inorganic hybrid polymer and the organometallic compound exist in a mixed state. Therefore, since a flexible portion is inserted into the chain forming the network structure, as a film physical property, it has the flexibility that the organic polymer has and the toughness and heat resistance that the inorganic polymer has in combination, for all practical purposes, is excellent at processing appropriateness.

Hereinafter, Examples of the first aspect of the present invention will be described.

EXAMPLES A SERIES

1. Preparation of Organic-inorganic Hybrid Polymer Starting Solution

Ethyl methacrylate and γ-methacryloxypropyltrimethoxy silane (FBM 503; made by Shinetsu Chemical Industries, Ltd., Co.) were blended at molar ratio of 6:4, and as a solvent, benzene was used, as an initiator, benzoyl peroxide was used, and polymerized under the reflux for 8 hours. After the reaction was terminated, purification was carried out by removing non-reacted substances and benzene and followed by drying under reduced pressure, and thus an organic-inorganic hybrid polymer was obtained.

The above-described obtained organic-inorganic hybrid polymer was dissolved in acetone, and further, water, hydrochloric acid and zirconium butoxide as an organometallic compound (Orgaticks ZA 60; made by Matshmoto Trading, Ltd., Co.) were added, and an organic-inorganic hybrid polymer starting solution was obtained by the sol-gel reaction.

2. Preparation of Volume Hologram

Next, a photosensitive composition solution for volume hologram recording of the following composition was prepared.

<Photosensitive Composition Solution for Volume Hologram Recording>

Organic-inorganic hybrid polymer starting solution prepared as described above: 100 weight parts (solid content)

Polysthyleneglycol dimethacrylate (9G; made by Shinnakamura Chemical Industry, Ltd., Co.): 60 weight parts 1-hydroxycyclohexylphenyl ketone (Irgacure 184; made by Chiba Speciality Chemicals, Ltd., Co.): 2 weight parts 3-ethyl-5-[(3-ethyl-2(3H)-benzothiazolidene) ethylidene]-2-thioxo-4-oxazolidinone (NK-1473; made by Hayashibara Biochemical Institute): 0.02 weight parts Methanol: 30 weight parts Methyethyl ketone: 30 weight parts The above-described solution was coated on polyethylene terephthalate (PET) film in the thickness of 38 μm (Lumirror T-60; made by Toray, Ltd., Co.) using the bar coater so as to be the thickness of 20 μm as a dried film, and further, a hologram recording material layer was formed in a gel state by heating, and the photosensitive medium for volume hologram recording was prepared.

Next, the side of the hologram recording material layer of the photosensitive medium for volume hologram recording was laminated on a mirror, 514.5 nm argon ion laser beam was incident from the PET side, the interferential exposure to the beam was performed and a volume hologram was recorded.

Next, the interference fringe was fixed by heating and ultraviolet ray polymerization, and the volume hologram was obtained. As a result of calculating from the spectral evaluation, the refractive index modulation amount Δn was 0.056.

B. The Second Aspect of the Present Invention

Next, a photosensitive composition for volume hologram recording belonging to the second aspect of the present invention contains at least an organic-inorganic hybrid polymer which is obtainable by copolymerizing at least an organic silicon compound represented by the following general formula 3 and a monomer having an ethylenically unsaturated bonding and/or a hydrolyzed polycondensate of said organic-inorganic hybrid polymer, an organometallic particle which has a photopolymerization reactive group and is capable of exhibiting a refractive index different from that of hydrolyzed polycondensate of said organic-inorganic hybrid polymer when said organometallic particle is in a form of a polymer and a photopolymerization initiator:

$$R^4{}_m Si\,(OR^5)_n \quad \text{General formula 3:}$$

Wherein $R^4$ may be identical or different and is a group having an ethylenically unsaturated bonding (such as an ethylenically double bonding) and containing 1-10 carbon atoms, $R^5$ may be identical or different and is an alkyl group containing 1-10 carbon atoms, $m+n=4$, $m \geq 1$ and $n \geq 1$.

The second aspect belongs to the first aspect, and the second aspect occupies one portion of the first aspect. Specifically, in the second aspect, it is characterized in that an organic silicon compound represented by the above-described general formula 3 is used as an organometallic compound represented by the general formula 1 of the first aspect, an organometallic particle which has a photopolymerization reactive group and is capable of exhibiting a refractive index different from that of hydrolyzed polycondensate of said organic-inorganic hybrid polymer when said organometallic particle is in a form of a polymer is used as a photopolymerization reactive compound of the first aspect.

As to a photosensitive composition for volume hologram recording belonging to the second aspect, similar to the other photosensitive compositions belonging to the first aspect, a hologram recording material layer excellent at a variety of performances is formed by coating a photosensitive composition for volume hologram recording on the substrate, and then performing the hydrolysis and the polycondensation polymerization, or by coating the photosensitive composition for volume hologram recording containing hydrolysis condensate of the photosensitive composition on the substrate and drying it.

An organic-inorganic hybrid polymer used in the second aspect is a copolymer obtainable by copolymerizing at least an organometallic compound represented by the following general formula 3 as a principal chain component and an organic monomer having an ethylenically unsaturated bonding also as a principal chain component, and preferably a random copolymer.

As an organic silicon compound of the general formula 3, a variety of kinds of vinylalkoxy silane as exemplified as an organometallic compounds of the general formula 1 in the first aspect can be preferably employed. Moreover, an organic monomer having an ethylenically unsaturated bonding can be also preferably employed similarly to those in the first aspect.

An organic-inorganic hybrid polymer can be manufactured by performing the addition polymerization reaction of a group containing an ethylenically unsaturated bonding of the organometallic compound represented by the general formula 3 and an ethylenically unsaturated bonding of the organic monomer by the general method. Concretely, it can be manufactured by the method similar to that used for the other photosensitive composition belonging to the first aspect. Moreover, an organic-inorganic hybrid polymer generated by the sol-gel reaction of the organometallic compound represented by the general formula 3 and the organic monomer has also a network structure similar to that of the other photosensitive compositions belonging to the first aspect.

In the second aspect, it is characterized in that as an inorganic unit constituting the principal chain of an organic-inorganic hybrid polymer, an organic silicon Compound is particularly used. Since as to an organic silicon compound, the refractive index is quite lower than the other organometallic compounds, the use of the organic silicon compound makes it possible to take a large difference of refractive indices with an organometallic particle as a refractive index modulation component described later. The refractive index modulation amount (Δn) of it calculated by Kogelnik theory becomes larger comparing with the conventional combinations using an organic binder polymer and an organic monomer as the refractive index modulation component, and it is advantageous from the viewpoint of the performance.

Furthermore, since an organic-inorganic hybrid polymer contains an inorganic principal chain component derived from the organic silicon compound, the dispersion property of the organometallic particle in which almost all is constituted of inorganic component is excellent and the photosensitive composition for volume hologram recording is easily prepared to be a uniform coating liquid.

Moreover, in Japanese Patent Laid-open 2000-508783, a system in which a reactive metallic particle is dispersed in the solid matrix has been disclosed, however, the fluidity of the solid matrix is made large for all practical purposes, there are some problems on the processing appropriateness and appropriateness for mass production. To the contrary, in the present invention, since an organic-inorganic hybrid polymer is used as a binder polymer, the processing appropriateness is enhanced.

Similar to the other photosensitive composition belonging to the first aspect, in a photosensitive composition for volume hologram recording belonging to the second aspect, a partial or complete hydrolyzed condensate of the foregoing organic-inorganic hybrid polymer may be employed as a binder polymer, or the mixture of the foregoing organic-inorganic hybrid polymer and its partial or complete hydrolyzed condensate may be also employed.

As to a photosensitive composition for volume hologram recording of the present invention, it may be also employed as a binder polymer by mixing the foregoing organic-inorganic hybrid polymer and a variety of kinds of organic polymer corresponding to the use. As a concrete example of an organic polymer, an organic polymer exemplified in the first aspect can be also employed similarly in the second aspect.

Moreover, in second aspect, an organic silicon compound represented by the following general formula 4 may be added to the photosensitive component for volume hologram recording in order to further enhance the difference of the refractive index of the binder and the organometallic particle.

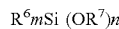

General formula 4:

wherein $R^6$ may be identical or different and is an alkyl group containing 1-10 carbon atoms, or a hydrocarbon group containing 1-10 carbon atoms and having an alkoxyl, a vinyl, an acryloyl, a methacryloyl, an epoxy, an amide, a sulfonyl, a hydroxyl or a carboxyl, R7 may be identical or different and is an alkyl group containing 1-10 carbon atoms, m+n=4, m$\geq$1, and n$\geq$1.

When the organic silicon compound represented by the general formula 4 is added to the photosensitive composition for volume hologram recording, the organic silicon compound of the general formula 4 forms the network along with the above-described organic-inorganic hybrid polymer by the sol-gel reaction in the presence of water and acid catalyst, there are the effect not only to accelerate lowering of the refractive index of the binder, but also the effect to enhance the toughness and heat resistance of the film. By blending the above-described organic silicon compound, a large amount of Si which is an inorganic component is incorporated in the photosensitive composition for volume hologram recording, accordingly, the effect that the dispersion of the organometallic particle is further enhanced.

As an organic silicon compound represented by the general formula 4, for example, tetramethoxy silane, tetraethoxy silane, tetra-iso-propoxy silane, tetra-n-propoxy silane, tetra-n-butoxy silane, tetra-sec-butoxy silane, tetra-tert-butoxy silane, tetrapentaethoxy silane, tetrapenta-iso-propoxy silane, tetrapenta-n-propoxy silane, tetrapenta-n-butoxy silane, tetrapenta-sec-butoxy silane, tetrapenta-tert-butoxy silane, methyltrimethoxy silane, methyltriethoxy silane, methyltripropoxy silane, methyltributoxy silane dimethyldimethoxy silane, dimethyldiethoxy silane, dimethylmethoxy silane, dimethylethoxy silane, dimethylpropoxy silane, dimethylbutoxy silane, mathyldinethoxy silane, methyldiethoxy silane, hexyltrimethoxy silane, vinyltriethoxy silane, γ-(methacryloxypropyl) trimethoxy silane, γ-glyoidoxypropyltrimethoxy silane, 3-(2-aminoethylaminopropyl) trimethoxy silane, vinyltrichloro sialne, vinyl tris(β-methoxyethoxy) silane, vinyltrimethoxy silane, β-(3,4-epoxycyclohexyl) ethyltrimethoxy silane, γ-glycidoxypropylmethyldiethoxy silane, N-β(aminoethyl)γ-aminopropylmethyldimethoxy silane, γ-aminopropyltriethoxy silane, N-phenyl-γ-aminopropyltrimethoxy silane, γ-mercaptopropyltrimethoxy silane, γ-chloropropyltrimethoxy silane and the like are preferably employed.

Although the organic-inorganic hybrid polymer and the organic silicon compound represented by the general formula 4 form a network in which both exist in a mixture state by hydrolyzing and polycondensing both after mixing these, in principle, it is also possible to form the network in which both exist in a mixture state by partially hydrolyzing and polycondensing one of these or both of these beforehand, and mixing them and further hydrolyzing and polycondensing after the mixing.

An organometallic particle is a component (refractive index modulation component) for forming an interference fringe by modulating the refractive index of the strongly exposed regions at the time when the interferential exposure is done. The organometallic particle to be used has at least one photopolymerization reactive group which has reactivity of polymerization, and it can exhibit, when it is in a form of a polymer obtained by polymerizing the relevant organometallic particle, a refractive index different from the refractive index of the hydrolyzed polycondensate of the above-described organic-inorganic hybrid polymer, and preferably the organometallic particle causing the difference of the both refractive indices as 1.0 or more is employed.

An organometallic particle is a compound that on the surface of the metallic particle, at least any one of functional group capable of performing the photo-induced polymerization such as photo-radical polymerization, photo-cationic polymerization and the like is bonded.

Although a metallic component of an organometallic particle is not particularly limited if it can get the difference of the refractive indices with the organic-inorganic hybrid polymer containing a principal chain component derived from the relevant organic silicon compound, since the organic silicon compound is an organometallic compound whose refractive index is comparatively low, it is preferable to employ the organometallic particle constituted of a metallic component having a refractive index as high as possible. As a metallic component having a higher refractive index, for example, Ti, Zr, Zn, In, Sn and the like can be exemplified.

Moreover, the size of the metallic particle is not particularly limited, but from the viewpoints of resolution and transparency of the visible light, it is preferable that it ranges from about 5 to about 200 nm.

As a functional group capable of performing the photo-radical polymerization, an ethylenically unsaturated bonding capable of performing the addition polymerization can be exemplified, this can be introduced by processing the surface of the metallic particle with a coupling agent containing an ethylenically unsaturated bonding. As a coupling agent containing an ethylenically unsaturated bonding, for example, a silane coupling agent such as vinyl silane, acryloyl silane, methacryloyl silane and the like can be employed.

As a functional group capable of performing the photo-cationic polymerization, cyclic ethers of which epoxy ring and oxetane ring are representative, thio ethers and vinyl ethers can be employed, this can be introduced by processing the surface of the metallic particle with a coupling agent containing these functional group. As a coupling agent containing an epoxy ring, for example, a silane coupling agent such as β-(3,4-epoxycylohexyl) ethyltrimethoxy silane, γ-glycidoxypropyltrimethoxy silane and the like can be employed.

In the second aspect, a photopolymerization initiator is employed for initiating or promoting the polymerization due to the interferential exposure of the organic metallic particle, and it is appropriately selected from photo-radical polymerization initiators and photo-cationic polymerization initiators and the like in accordance with the reaction type of polymerization and employed.

As a concrete example of a photo-radical polymerization initiator and a photo-cationic polymerization initiator, an initiator capable of being employed in the first aspect can be also employed here. Moreover, the fact that the initiator processed and decomposed after the hologram recording (for example, organic peroxide based initiator) is preferable is similar to the fact in the first aspect. As to a visible laser beam, the beam capable of being employed in the first aspect can be also employed for recording of the hologram As to a sensitizing pigment, the pigment employed in the first aspect can be also employed.

An organometallic particle as a refractive index modulation component is used at the ratio of 10-1000 weight parts with respect to 100 weight parts of the organic-inorganic hybrid polymer which is the binder polymer, and preferably at the ratio of 10-100 weight parts with respect to 100 weight parts of the binder polymer.

An organic silicon compound represented by the general formula 4 blended if it is necessary is used at the ratio of 10-100 weight parts of it with respect to 100 weight parts of the binder polymer, and preferably at the ratio of 20-70 weight parts of it to 100 weight parts of the binder polymer.

As to a photopolymerization initiator, it is used at the ratio of 1-10 weight parts of it with respect to 100 weight parts of the binder polymer, and preferably at the ratio of 5-10 weight parts of it to 100 weight parts of the binder polymer.

As to a sensitizing pigment, it is used at the ratio of 0.01-1 weight parts with respect to 100 weight parts of the binder polymer, and preferably at the ratio of 0.01-0.5 weight parts with respect to 100 weight parts of the binder polymer.

By dissolving the respective materials with the similar solvent capable of being employed in the first aspect, a coating liquid as a photosensitive composition for volume hologram recording pertaining to the present invention can be prepared.

The above-described coating liquid is coated on an appropriate substrate by the method of spin coater, gravure coater, comma coater, bar coater or the like. The thickness of a volume hologram material layer may be 1-100 µm, and preferably, 10-40 µm.

In the second aspect, by the similar method in the above-described first aspect, a coating film (volume hologram recording material layer) of a photosensitive composition for volume hologram recording is formed on the substrate, and a photosensitive medium for volume hologram recording can be obtained. Specifically, in the second aspect, a substrate similar to those used in the first aspect can be employed, the sol-gel reaction can be performed under the similar conditions to those of the first aspect, the order of the processes of coating and drying and the processes of hydrolysis and polycondensation can be replaced, the order of the process of hydrolyzing an organic-inorganic hybrid polymer and the process of mixing the other components can be replaced, the organic silicon compound represented by the general formula 4, which is an accessory binder can be used by the method similar to that of the organometallic compound represented by the general formula 2 in the first aspect, and the coverage can be performed by the protective film on the volume hologram recording material layer.

The photosensitive medium for volume hologram recording thus obtained of the second aspect is a medium in which the volume hologram recording material layer is provided on the substrate, the relevant volume hologram recording material layer contains a hydrolyzed polycondensate made from the organic-inorganic hybrid polymer or a mixture of the organic-inorganic hybrid polymer and the organic silicon compound, a photopolymerization reactive component and a photopolymerization initiator as essential components, the relevant hologram recording material layer is formed in a structure in which the other components such as the photopolymerization reactive component and the photopolymerization initiator and the like get into a gapping of the network which is made of a hydrolyzed polycondensate of the organic-inorganic hybrid polymer or a hydrolyzed polycondensate of the mixture of the organic-inorganic hybrid polymer and the organometallic compound.

On a photosensitive medium for volume hologram recording of the second aspect, a volume hologram can be formed by performing the interferential exposure by the method conventionally known, that is similar to that of the first aspect. Moreover, it is considered that the recording mechanism is also similar to the mechanism conventionally referred to.

It is considered that the difference of the refractive indices occurred in the interference fringe of the hologram layer in the second aspect is a difference of the refractive indices generated between the regions containing the organic-inorganic hybrid polymer which is a binder polymer at a high ratio and the regions containing the organometallic particle or its polymerized product at a high ratio. Since the organic-inorganic hybrid polymer used in the present invention contains Si as an inorganic component and the refractive index is quite low, the difference of the refractive indices with the organometallic particle can be taken large, and a volume hologram having a large refractive index modulation amount ($\Delta n$) is obtained.

A hologram recording material layer of a photosensitive medium for volume hologram recording of the second aspect generates an interference fringe by the interferential exposure to be a hologram layer, this hologram layer is, similar to the above-described hologram recording material layer, has a network structure of a hydrolyzed polycondensate of the organic-inorganic hybrid polymer or a hydrolyzed polycondensate of the mixture of the organic-inorganic hybrid polymer and the organometallic compound. Therefore, since a flexible portion is inserted into the chain forming the network structure, as a film physical property, it has the flexibility that the organic polymer has and the toughness and heat resistance that the inorganic polymer has in combination and, for all practical purposes, is excellent at processing appropriateness.

Hereinafter, Examples of the second aspect of the present invention will be described.

EXAMPLES B SERIES

1. Preparation of Organic-inorganic Hybrid Polymer Starting Solution

Ethyl methacrylate and γ-methacryloxypropyltrimethoxy silane (KBM 503; made by Shinetsu Chemical Industries, Ltd., Co.) were blended at molar ratio of 6:4, and as a solvent, benzene was used, as an initiator, benzoyl peroxide was used, and polymerized under the reflux for 8 hours. After the reaction was terminated, After the reaction was terminated, purification was carried out by removing non-reacted substances and benzene and followed by drying under reduced pressure, and thus an organic-inorganic hybrid polymer was obtained.

The above-described obtained organic-inorganic hybrid polymer was dissolved in acetone, and further, water, hydrochloric acid and tetraethoxy silane as an organic silicon compound (KBE 04; made by Shinetsu Chemical Industries, Ltd., Co.) were added, and an organic-inorganic hybrid polymer starting solution was obtained by sol-gel reaction.

2. Preparation of Volume Hologram

Next, a photosensitive composition solution for volume hologram recording of the following composition was prepared.

<Photosensitive Composition Solution for Volume Hologram Recording>

Organic-inorganic hybrid polymer starting solution prepared as described above: 100 weight parts (solid content)

Zirconium particle into which ethylenically unsaturated bonding was introduced (zirconium particle processed with γ-methacryloxypropyl trimethoxy silane): 60 weight parts 1-hydroxycyclohexylphenyl ketone (Irgacure 184; made by Chiba Specialty Chemicals, Ltd., Co.): 2 weight parts 3-ethyl-5-[(3-ethyl-2(3H)-benzothiazolidene) ethylidene]-2-thioxo-4-oxazolidinone (NK-1473; made by Hayashibara Biochemical Institute): 0.02 weight parts Methanol: 30 weight parts Methyethyl ketone: 30 weight parts The above-described solution was coated on polyethylene terephthalate (PET) film in the thickness of 38 μm (Lumirror T-60; made by Toray) using the bar coater so as to be the thickness of 20 μm as a dried film, and further, a hologram recording material layer was formed in a gel by heating, and the photosensitive medium for volume hologram recording was prepared.

Next, the side of the hologram recording material layer of the photosensitive medium for volume hologram recording was laminated on a mirror, 514.5 nm argon ion laser beam was incident from the PET side, the interferential exposure to the beam was performed and a volume hologram was recorded.

Next, the interference fringe was fixed by heating and ultraviolet ray polymerization, and the volume hologram was obtained. As a result of calculating from the spectral evaluation, the refractive index modulation amount Δn was 0.051.

C. The Third Aspect of the Present Invention

A photosensitive composition for volume hologram recording belonging to the third aspect of the present invention is characterized in that it contains at least a binder resin bonded to a metal, a photopolymerization reactive compound, and a photopolymerization initiator.

Moreover, the other form belonging to the third aspect is characterized in that it contains at least a binder resin containing hydroxyl group and/or carboxyl group, a metal chelate compound, a photopolymerization reactive compound, and a photopolymerization initiator.

Binder Resin:

A binder resin usable in the third aspect may be a binder resin bonded to a metal, or a binder resin having hydroxyl group and/or carboxyl group which is a functional group capable of bonding to the metal chelate compound described later.

As a binder resin having hydroxyl group and/or carboxyl group which is a functional group capable of bonding to the metal chelate compound, for example, polymethacrylic ester having hydroxyl group or their partial hydrolysate, polyvinyl acetate or its partical hydrolysate, polyvinyl alcohol or its partial acetalisate, bisphenol A type epoxy resin, bisphenol F type epoxy resin, triacetyl cellulose, polyisoprene, polybutadien, polychloroprene, silicon rubber, polystyrene, poly(vinyl butyral), polychloroprene, poly(vinyl chloride), chlorinated polyethylene, chlorinated polypropylene, poly-N-vinyl carbasol or its derivative, poly-N-vinyl pyrolidone or its derivative, a copolymer of styrene and maleic anhydride or its half ester, a copolymer comprising at least one polymerization component selected from the copolymerizable monomers including acrylic acid, acrylic ester, methacrylic acid, methacrylic ester, acrylamide, acrylnitrile, ethylene, propylene, vinyl chloride, vinyl acetate and the like and their mixtures are listed. It as essential that any resin is polymerized with a monomer component containing hydroxyl group or carboxyl group as the side chain.

As a binder resin bonded to a metal, it is possible to use a binder resin in which a metal is introduced into the binder resin by previously reacting a binder resin having hydroxyl group and/or carboxyl group which is a functional group capable of bonding to the metal chelate compound described above and a metal chelate compound described later.

It is desirable that if the average molecular weight of the binder resin is in the range of 1,000-10,000 (what is called, oligomer), a high difference of the refractive indices can be made in the volume hologram finally obtained as described above. The average molecular weight of the binder resin is determined as a value calibrated to that of polystyrene measured by the gel permeation chromatography (GPC).

Metal Chelate Compound:

As a metal chelate compound capable of bonding to the foregoing oligomer, a variety of kinds of metal coupling agents are listed, and as a metal, Ti, Zr, Za, Sn, In and the like are exemplified. As a concrete example of titanium coupling agent, titanium dipropoxydiacetylacetonate (Orgaticks TC-100; trade name; made by Matsumoto Pharmaceutical, Ltd., Co.), titanium tetraacetyl acetonate (Orgaticks TC-401; trade name; made by Matsumoto Pharmaceutical, Ltd., Co.), titanium dioctoxydiioctylene glycolate (orgaticks TC-200; trade name; made by Matsumoto Pharmaceutical, Ltd., Co.), titanium dipropoxydiethylacetate (Orgaticks TC-750; trade name; made by Matsumoto Pharmaceutical, Ltd., Co.), titanium dipropoxyditriethanol aminate (Orgaticks TC-400; trade name; made by Matsumoto Pharmaceutical, Ltd., Co,), and a variety of kinds of titanium coupling agents including the following formulas are exemplified.

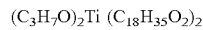

(KR-TTS: trade name; made by Ajinomoto Fine Techno, Ltd., Co.)

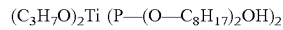

(KR41B: trade name; made by Ajinomoto Fine Techno, Ltd., Co.)

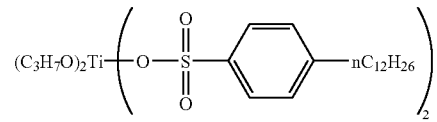

(KR-9SA: trade name; made by Ajinomoto Fine Techno, Ltd., Co.)

As a concrete example of zirconium coupling agent, zirconium tetraacetyl acetonate (Orgaticks ZC-150: trade name; made by Matsumoto Pharmaceutical, Ltd., Co.), zirconium tributoxyacetyl acetonate (Orgaticks ZC-540:

trade name; made by Matsumoto Pharmaceutical, Ltd., Co.), zirconium dibutoxy bis(acetyl acetonate) (Orgaticks ZC-550: trade name; made by Matsumoto Pharmaceutical, Ltd., Co.), zirconium tributoxcyethyl acetoacetate (Orgaticks ZC-560: trade name; made by Matsumoto Pharmaceutical, Ltd., Co.) are exemplified.

These metal coupling agents may be previously introduced into a binder resin, or it may be introduced into a binder resin in processes after blending into the photosensitive composition for volume hologram recording, such as a process forming a coating layer or a process of post treatment after recording the hologram.

As a photopolymerization reactive compound, a photoradical polymerization compound and a photo-cationic polymerization compound can be employed, as these concrete examples, a compound exemplified in the first aspect can be also similarly used in the third aspect.

Moreover, in the third aspect, in order to enlarge the difference of the refractive indices with a binder resin, it is preferable to use the photopolymerization reactive compound having a low refractive index, and as its concrete example, the monomer having a refractive index of 1.49 or less as exemplified in the first aspect and an oligomer and polymer obtained from such a monomer can be similarly used.

Photopolymerization Initiator:

In the third aspect, a photopolymerization initiator used in the first aspect can be also used by the similar method.

Light Used in the Recording of Hologram:

In the third aspect, a hologram can be recorded using the similar light used in the first aspect.

Sensitizing Pigment:

In the third aspect, a sensitizing pigment used in the first aspect can be used by the similar method.

Epoxy Hardening Catalyst:

In the case where multifunctional epoxy compound is used as a binder resin, as an epoxy hardening catalyst, a catalyst generating acid by heat or light is used, boron trifluoride, cupric chloride, aluminum chloride, aromatic diazonium salt, aromatic iodonium salt, aromatic sulfonium salt, aromatic phosphonium salt, multivalent carboxylic acid compound blocked with vinylether and the like are exemplified.

Blending Ratio:

It is desirable that a metal compound capable of bonding to a binder resin is blended at the ratio of 2-50 weight parts of it with respect to 100 weight parts of the binder resin, and preferably, at the ratio of 10-30 weight parts.

It is desirable that a photopolymerization reactive compound is blended at the ratio of 10-1,000 weight parts of it with respect to 100 weight parts of the binder resin, and preferably, at the ratio of 10-100 weight parts.

It is desirable that a photopolymerization initiator is blended at the ratio of 1-10 weight parts of it with respect to 100 weight parts of the binder resin, and preferably, at the ratio of 5-10 weight parts.

It is desirable that a sensitizing pigment is blended at the ratio of 0.01-1 weight parts of it with respect to 100 weight parts of the binder resin, and preferably, at the ratio of 0.01-0.5 weight parts.

Solvent:

A photosensitive composition for volume hologram recording of the third aspect can be prepared to be coating liquid using the similar solvent to the solvent used in the first aspect.

Substrate:

In the third aspect, a substrate used in the first aspect can be also used by the similar method.

Coating Film Formation:

A photosensitive medium for volume hologram recording of the third aspect is obtained by coating the above-described coating liquid on the above-described substrate by the method of spin coater, gravure coater, comma coater, bar coater or the like. The thickness of the photosensitive composition for a volume hologram record may be 1-100 µm, and preferably, 10-40 µm. Moreover, in the case where the volume hologram recording material layer has the adhesiveness following the drying, the film exemplified in the above-described substrate can be laminated as a protective film. In this case, the contact surface of the laminating film with the volume hologram recording material layer may be processed in a release type surface so as to be easily peeled off later.

Formation of Volume Hologram:

It is considered that the recording mechanism of volume hologram of a photosensitive composition for volume hologram recording belonging to the third aspect is similar to the mechanism described in the conventional technologies. When the relevant photosensitive composition formed in a film shape is exposed to an interferential light, the photoinduce polymerization is initiated at the regions where the light strongly irradiates, and accompanying with it, the concentration gradient of the photopolymerization reactive compound is made, and the diffusion shift of the photo polymeration reactive compound is occurred from the regions where the light weakly irradiates to the regions where the light strongly irradiates. As a result, regions where the photopolymerization reactive compound richly exists and regions where the binder polymer richly exists are made corresponding to the brightness and darkness of the interferential light, and this appears as the difference of the refractive indices. In the present invention, a metal atom having a high refractive index has been introduced into the binder resin, it is possible to enlarge its difference of the refractive index comparing with the conventional organic material series.

Moreover, in order to promote the refractive index modulation and complete the polymerization reaction, after the interferential exposure, the post processing of the whole surface exposure by ultraviolet, heating and the like can be appropriately performed. In the case where the binder resin is a multifunctional epoxy compound having hydroxyl group or carboxyl group, these post processing procedures are particularly effective in order to enhance the heat resistance.

Hereinafter, Examples of the third aspect of the present invention will be described.

EXAMPLES C SERIES

Example C-1

A solution of a binder resin bonded to a metal was prepared by blending the following components of the composition and agitating it at 30° C. for 24 hours.

<Composition of Binder Resin Solution>

Bisphenol A type epoxy resin (YD-7017: trade name; made by Toto Chemicals, Ltd., Co.): 100 weight parts Titanium chelate (Orgaticks TC-100: trade name: made by Matsumoto Pharmaceutical, Ltd., Co.): 30 weight parts MEK(Methyl ethyl ketone): 60 weight parts A photosensitive composition for volume hologram was prepared by further blending the following composition to the obtained binder resin solution.

<Additional Component for Photosensitive Composition>

Polyethylene glycol dimethacrylate (9G: trade name; made by Shinnakamura Chemical Industries, Ltd., Co.): 60 weight parts Irgacure 784 (trade name; Chiba Specialty Chemicals, Ltd., Co.): 2 weight parts Toluene: 20 weight parts The photosensitive medium for volume hologram recording was prepared by coating the above-described solution on polyethylene terephthalate (PET) film in the thickness of 38 μm (Lumirror T-60; made by Toray) using the bar coater so as to be the thickness of 20 μm as a dried film.

The photosensitive layer side was laminated on a mirror, 514.5 nm argon ion laser beam was incident from the PET side, the interferential exposure to the beam was performed and a volume hologram was recorded.

Next, the interference fringe was fixed by heating and ultraviolet ray polymerization, and the volume hologram was obtained.

As a result of calculating from the spectral evaluation, the refractive index modulation amount Δn was 0.056.

Example C-2

A photosensitive composition solution for volume hologram recording was prepared by blending the following components of the composition <Photosensitive Composition Solution>

Bisphenol A type epoxy resin (YD-7017: trade name; made by Toto Chemicals, Ltd., Co.): 100 weight parts Titanium chelate (orgaticks TC-100; trade name: made by Matsumoto Pharmaceutical, Ltd., Co.): 30 weight parts Polyethylene glycol dimethacrylate (9 g: trade name; made by Shinnakamura Chemical Industries, Ltd., Co.): 60 weight parts Irgacure 784 (trade name; Chiba Specialty Chemicals, Ltd., Co.): 2 weight parts Toluene: 30 weight parts Methylethyl ketone: 30 weight parts The photosensitive medium for volume hologram recording was prepared by coating the above-described solution on polyethylene terephthalate (PET) film in the thickness of 38 μm (Lumirror T-60; made by Toray) using the bar coater so as to be the thickness of 20 μm as a dried film.

The photosensitive layer side was laminated on a mirror, 514.5 nm argon ion laser beam was incident from the PET side, the interferential exposure to the beam was performed and a volume hologram was recorded.

Next, the interference fringe was fixed by heating and ultraviolet ray polymerization, and the volume hologram was obtained.

As a result of calculating from the spectral evaluation, the refractive index modulation amount Δn was 0.056.

According to the present invention, a volume hologram that the difference of the refractive indices of the binder and the photopolymerization reactive compound is increased can be provided.

According to the present invention, a volume hologram recording material, a volume hologram recording medium and a volume hologram having not only the hologram recording performances such as difference of refractive indices, sensitivity, transparency and the like, but also the film physical properties such as flexibility that the organic polymer has, the toughness and heat resistance that the inorganic polymer has can be provided, and the applications to the wider technical fields such as optical element and the like are expected.

In a photosensitive composition for volume hologram recording of the third aspect, in the case where an oligomer with an average molecule weight in the range of 1,000-10,000 is used as the binder resin, the shift of the photopolymerization reactive compound which is the refractive index modulation component becomes active during interferential exposures a high difference of the refractive indices in the volume hologram finally obtained can be realized by separation of the photopolymerization reactive compound from the binder resin.

In the case where the binder contained in the photosensitive composition for volume hologram recording of the third aspect is a multifunctional epoxy compound, a volume hologram excellent at heat resistance and mechanical strength can be obtained.

What is claimed is:

1. A photosensitive composition for volume hologram recording comprising an organic-inorganic hybrid polymer, its partially hydrolyzed polycondensate, its fully hydrolyzed polycondensate, or any combination thereof and an organometallic compound represented by the following general formula 2, further comprising a photopolymerization reactive compound and a photopolymerization initiator, wherein said organic-inorganic hybrid polymer is obtainable by copolymerizing at least said organometallic compound represented by the following general formula 1 and a monomer having an ethylenically unsaturated bonding:

$R^1{}_m M^1(OR^2)_n$ <span>General formula 1:</span> wherein $M^1$ represents a metallic atom, $R^1$ may be identical or different and represents a group having an ethylenically unsaturated bonding and containing 1-10 carbon atoms, $R^2$ may be identical or different and is alkyl group containing 1-10 carbon atoms, m+n represents the number of valence of metal $M^1$, $m \geq 1$ and $n \geq 1$, $M^2 R^3{}_{n'}$ <span>General formula 2:</span> wherein $M^2$ represents a metallic atom, $R^3$ may be identical or different and is a halogen, an alkyl group, alkoxyl group or acyloxy group containing 10 carbon atoms or less respectively or hydroxyl group, all or portion of these groups may be replaced with chelate ligand, and n' represents the number of valence of metal $M^2$.

2. A photosensitive composition for volume hologram recording according to claim 1, wherein said composition further comprises a sensitizing pigment.

3. A photosensitive composition for volume hologram recording according to claim 1, wherein said photopolymerization reactive compound is a compound having an ethylenically unsaturated bonding capable of performing addition polymerization and said photopolymerization initiator is a free radical polymerization initiator.

4. A photosensitive composition for volume hologram recording according to claim 1, wherein said photopolymerization reactive compound is a compound capable of performing cationic polymerization and said photopolymerization initiator is a photo-cationic polymerization initiator.

5. A photosensitive medium for volume hologram recording, wherein a coating layer of a photosensitive composition for volume hologram recording according to claim 1 is provided on a substrate.

6. A photosensitive medium for volume hologram recording, wherein a volume hologram recording material layer comprising a hydrolyzed polycondensate of an organic-inorganic hybrid polymer obtainable by copolymerizing at least an organometallic compound represented by the following general formula 1 and a monomer having an ethylenically unsaturated bonding and/or its hydrolyzed polycondensate and an organometallic compound represented by the following general formula 2, a photopolymerization reactive compound, and a photopolymerization initiator is provided on a substrate:

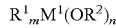  General formula 1:

wherein $M^1$ represents a metallic atom, $R^1$ may be identical or different and represents a group having an ethylenically unsaturated bonding and containing 1-10 carbon atoms, $R^2$ may be identical or different and is alkyl group containing 1-10 carbon atoms, m+n represents the number of valence of metal $M^1$, $m \geq 1$ and $n \geq 1$,

  General formula 2:

wherein $M^2$ represents a metallic atom, $R^1$ may be identical or different and is a halogen, an alkyl group, an alkoxyl group or an acyloxy group containing 10 carbon atoms or less respectively or a hydroxyl group, all or portion of these groups may be replaced with chelate ligand, and n' represents the number of valence of metal $M^2$.

7. A photosensitive medium for volume hologram recording according to claim 6, wherein said volume hologram recording material layer further comprises a sensitizing pigment.

8. A photosensitive medium for volume hologram recording according to claim 6, wherein said photopolymerization reactive compound is a compound having an ethylenically unsaturated bonding capable of performing addition polymerization and said photopolymerization initiator is a free radical polymerization initiator.

9. A photosensitive medium for volume hologram recording according to claim 6, wherein said photopolymerization reactive compound is a compound capable of performing cationic polymerization and said photopolymerization initiator is a photo-cationic polymerization initiator.

10. A photosensitive composition for volume hologram recording comprising an organic-inorganic hybrid polymer which is obtainable by copolymerizing at least an organic silicon compound represented by the following general formula 3 and a monomer having an ethylenically unsaturated bonding and/or a hydrolyzed polycondensate of said organic-inorganic hybrid polymer, an organometallic particle which has a photopolymerization reactive group and is capable of exhibiting a refractive index different from that of hydrolyzed polycondensate of said organic-inorganic hybrid polymer when said organometallic particle is in a form of a polymer and a photopolymerization initiator:

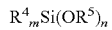  General formula 3:

wherein $R^4$ may be identical or different and is a group having an ethylenically unsaturated bonding and containing 1-10 carbon atoms, $R^5$ may be identical or different and is an alkyl group containing 1-10 carbon atoms, m+n=4, $m \geq 1$ and $n \geq 1$; and wherein the organometallic particle contains one or more metals selected from the group consisting of Ti, Zr, Zn, In and Sn.

11. A photosensitive composition for volume hologram recording according to claim 10, wherein said composition further comprises a second organic silicon compound represented by the following general formula 4:

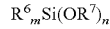  General formula 4:

wherein $R^6$ may be identical or different and is an alkyl group containing 1-10 carbon atoms, or a hydrocarbon group containing 1-10 carbon atoms and having an alkoxyl, a vinyl, an acryloyl, a methacryloyl, an epoxy, an amide, a sulfonyl, a hydroxyl or a carboxyl, $R^7$ may be identical or different is an alkyl group containing 1-10 carbon atoms, m+n=4, $m \geq 1$ and $n \geq 1$.

12. A photosensitive composition for volume hologram recording according to claim 10, wherein said hydrolyzed polycondensate is a hydrolyzed polycondensate of a second organometallic compound and said organic-inorganic hybrid polymer and/or its hydrolyzed polycondensates combined with a second organometallic compound represented by the following general formula 4:

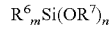  General formula 4:

wherein $R^6$ may be identical or different and is an alkyl group containing 1-10 carbon atoms, or a hydrocarbon group containing 1-10 carbon atoms and having an alkoxyl, a vinyl, an acryloyl, a methacryloyl, an epoxy, an amide, a sulfonyl, a hydroxyl or a carboxyl, $R^7$ may be identical or different and is an alkyl group containing 1-10 carbon atoms, m+n=4, $m \geq 1$, and $n \geq 1$.

13. A photosensitive composition for volume hologram recording according to claim 10, wherein, said composition further comprises a sensitizing pigment.

14. A photosensitive composition for volume hologram recording according to claim 10, wherein said organometallic particle is a compound having an ethylenically unsaturated bonding capable of performing addition polymerization as a photopolymerization reactive group and said photopolymerization initiator is a polymerization initiator.

15. A photosensitive composition for volume hologram recording according to claim 10, wherein said organometallic particle is a compound having a cationic polymerization group as a photopolymerization reactive group and said photopolymerization initiator is a photo-cationic polymerization initiator.

16. A photosensitive medium for volume hologram recording, wherein a coating layer of a photosensitive composition for volume hologram recording according to claim 15 is provided on a substrate.

17. A photosensitive composition for volume hologram recording according to claim 10, wherein the organometallic particle is used at the ratio of 10 to 1000 weight parts with respect to 100 weight parts of the organic-inorganic hybrid polymer and/or the hydrolyzed polycondensate thereof.

18. A photosensitive composition for volume hologram recording according to claim 10, wherein a size of the organometallic particle is in the range of 5 to 100 nm.

19. A photosensitive medium for volume hologram recording, wherein a volume hologram recording material layer comprising a hydrolyzed polycondensate of an organic-inorganic hybrid polymer obtainable by copolymerizing at least an organic silicon compound represented by the following general formula 3 and a monomer having an ethylenically unsaturated bonding, and an organometallic particle which has a photopolymerization reactive group and is capable of exhibiting a refractive index different from that of hydrolyzed polycondensate of said organic-inorganic hybrid polymer when said organometallic particle is in a form of a polymer and a photopolymerization initiator is provided on a substrate:

$$R^4{}_m Si(OR^5)_n \qquad \text{General formula 3:}$$

wherein $R^4$ may be identical or different and is a group having an ethylenically unsaturated bonding and containing 1-10 carbon atoms, $R^5$ may be identical or different and is an alkyl group containing 1-10 carbon atoms, m+n4, m≧1 and n≧1; and wherein the organometallic particle contains one or more metals selected from the group consisting of Ti, Zr, Zn, In and Sn.

20. A photosensitive medium for volume hologram recording according to claim 19, wherein said hydrolyzed polycondensate contained in said volume hologram recording material layer is a hydrolyzed polycondensate of said organic-inorganic hybrid polymer and/or its hydrolyzed polycondensate and a second organic silicon compound represented by the following general formula 4:

$$R^6{}_m Si(OR^7)_n \qquad \text{General formula 4:}$$

wherein $R^6$ may be identical or different and is an alkyl group containing 1-10 carbon atoms, or a hydrocarbon group containing 1-10 carbon atoms and having an alkoxyl, a vinyl, an acryloyl, a methacryloyl, an epoxy, an amide, a sulfonyl, a hydroxyl or a carboxyl, $R^7$ may be identical or different and is an alkyl group containing 1-10 carbon atoms, m+n=4, m≧1 and n≧1.

21. A photosensitive medium for volume hologram recording according to claim 19, wherein said volume hologram recording material layer further comprises a sensitizing pigment.

22. A photosensitive medium for volume hologram recording according to claim 19, wherein said organometallic particle is a compound having an ethylenically unsaturated bonding capable of performing addition polymerization as a photopolymerization reactive group and said photopolymerization initiator is a free radical polymerization initiator.

23. A photosensitive medium for volume hologram recording according to claim 19, wherein said organometallic particle is a compound having a cationic polymerization group as a photopolymerization reactive group and said photopolymerization initiator is a photo-cationic polymerization initiator.

* * * * *